(12) United States Patent
He et al.

(10) Patent No.: US 12,495,595 B2
(45) Date of Patent: Dec. 9, 2025

(54) SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Chuan He, Suzhou (CN); Xiaoqing Pu, Suzhou (CN); Ronghui Hao, Suzhou (CN); Jinhan Zhang, Suzhou (CN); King Yuen Wong, Suzhou (CN)

(73) Assignee: INNOSCIENCE (SUZHOU) TECHNOLOGY CO., LTD., Suzhou (CN)

(*) Notice: Subject to any disclaimer, the term of this patent is extended or adjusted under 35 U.S.C. 154(b) by 48 days.

(21) Appl. No.: 17/598,311

(22) PCT Filed: Aug. 11, 2021

(86) PCT No.: PCT/CN2021/112112
§ 371 (c)(1),
(2) Date: Feb. 16, 2023

(87) PCT Pub. No.: WO2023/015494
PCT Pub. Date: Feb. 16, 2023

(65) Prior Publication Data
US 2024/0047536 A1    Feb. 8, 2024

(51) Int. Cl.
*H10D 64/00* (2025.01)
*H10D 30/01* (2025.01)
(Continued)

(52) U.S. Cl.
CPC ......... *H10D 64/112* (2025.01); *H10D 30/015* (2025.01); *H10D 30/475* (2025.01); *H10D 62/8503* (2025.01); *H10D 64/01* (2025.01)

(58) Field of Classification Search
CPC .... H10D 64/01; H10D 64/111; H10D 64/112; H10D 64/117; H10D 64/20; H10D 64/23;
(Continued)

(56) References Cited

U.S. PATENT DOCUMENTS 9,722,063 B1 * 8/2017 Kudymov ............ H10D 64/112
10,930,745 B1    2/2021 Lin et al.
(Continued)

FOREIGN PATENT DOCUMENTS

| CN | 112038402 A | 12/2020 |
| CN | 112420825 A | 2/2021 |
| TW | 201838178 A | 10/2018 |

OTHER PUBLICATIONS

First Office Action of the corresponding China patent application No. 202180003767.8 mailed on Jul. 18, 2022.
(Continued)

*Primary Examiner* — Natalia A Gondarenko
(74) *Attorney, Agent, or Firm* — Li & Cai Intellectual Property (USA) Office

(57) ABSTRACT

A semiconductor device includes a first and a second nitride-based semiconductor layers, a gate electrode, a first and a second field plates, and a first dielectric layer. The first field plate is disposed above the second nitride-based semiconductor layer. The second field plate is discontinuous and disposed above the second nitride-based semiconductor layer and in a position higher than the first field plate. The second field plate includes one or more enclosed discontinuities in a discontinuity region thereof. The first dielectric layer is disposed above the second field plate. The first dielectric layer covers and penetrates the second discontinuous field plate in the discontinuity region such that the
(Continued)

second field plate encloses at least one portion of the first dielectric layer within its one or more enclosed discontinuities.

20 Claims, 11 Drawing Sheets

(51) Int. Cl.
*H10D 30/47* (2025.01)
*H10D 62/85* (2025.01)
*H10D 64/01* (2025.01)

(58) Field of Classification Search
CPC .. H10D 64/251; H10D 64/254; H10D 64/257; H10D 64/258; H10D 64/27; H10D 64/311; H10D 64/513; H10D 64/518; H10D 30/015; H10D 30/021; H10D 30/40; H10D 30/47–476; H10D 62/8503; H10D 62/852; H10D 62/213; H10D 62/221; H10D 62/10; H10D 62/126; H10D 62/343

USPC .................................... 257/194, 196, 76, 77
See application file for complete search history.

(56) References Cited

U.S. PATENT DOCUMENTS

| | | |
|---|---|---|
| 2012/0018735 A1 | 1/2012 | Ishii |
| 2016/0218189 A1* | 7/2016 | Oasa .................. H10D 64/112 |
| 2016/0260615 A1 | 9/2016 | Hirai et al. |
| 2019/0280092 A1 | 9/2019 | Lin et al. |
| 2019/0355844 A1 | 11/2019 | Sheridan |
| 2020/0373420 A1 | 11/2020 | Chou et al. |

OTHER PUBLICATIONS

International Search Report and Written Opinion of the corresponding PCT application No. PCT/CN2021/112112 mailed on May 7, 2022.

* cited by examiner

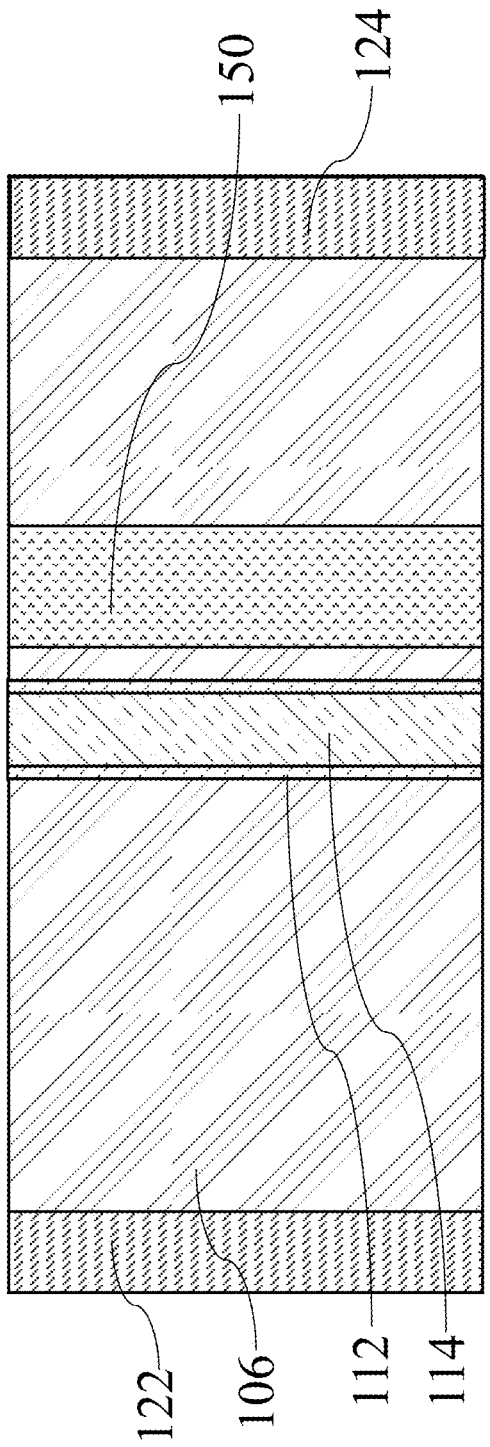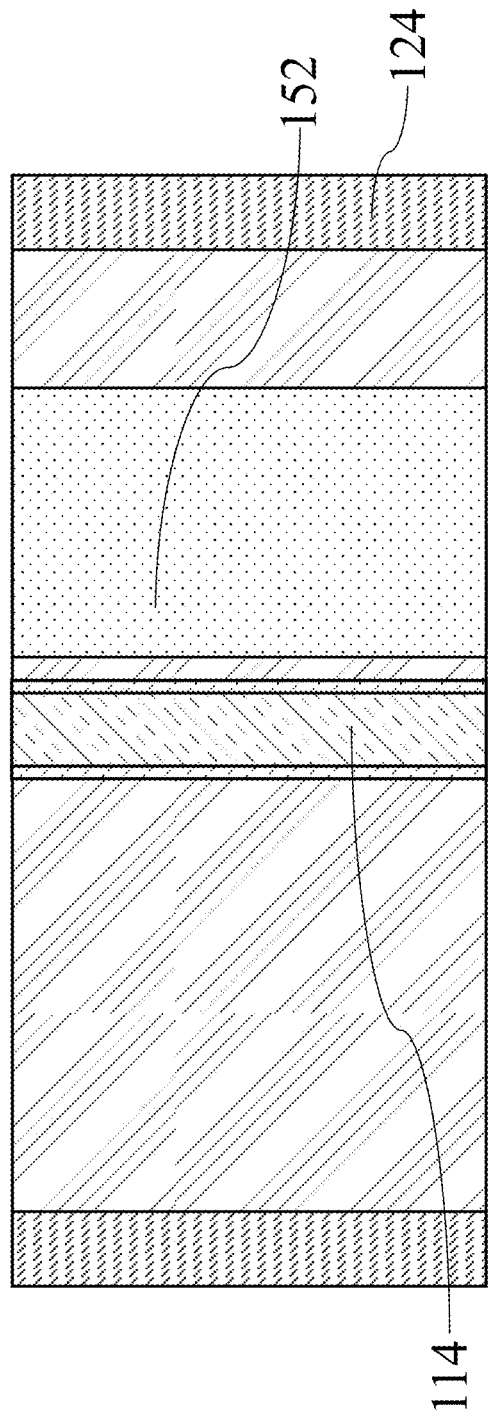

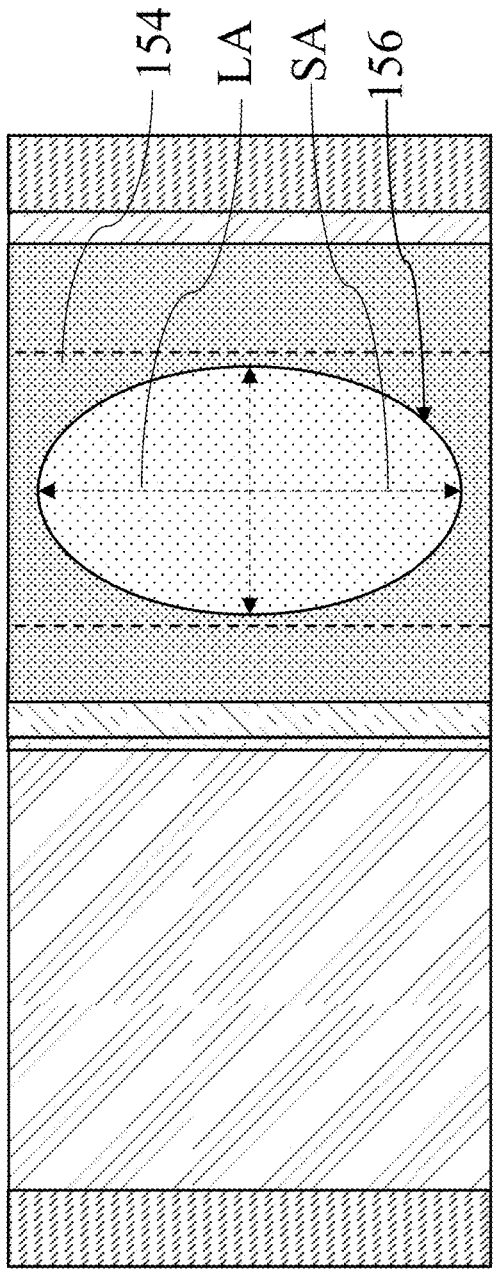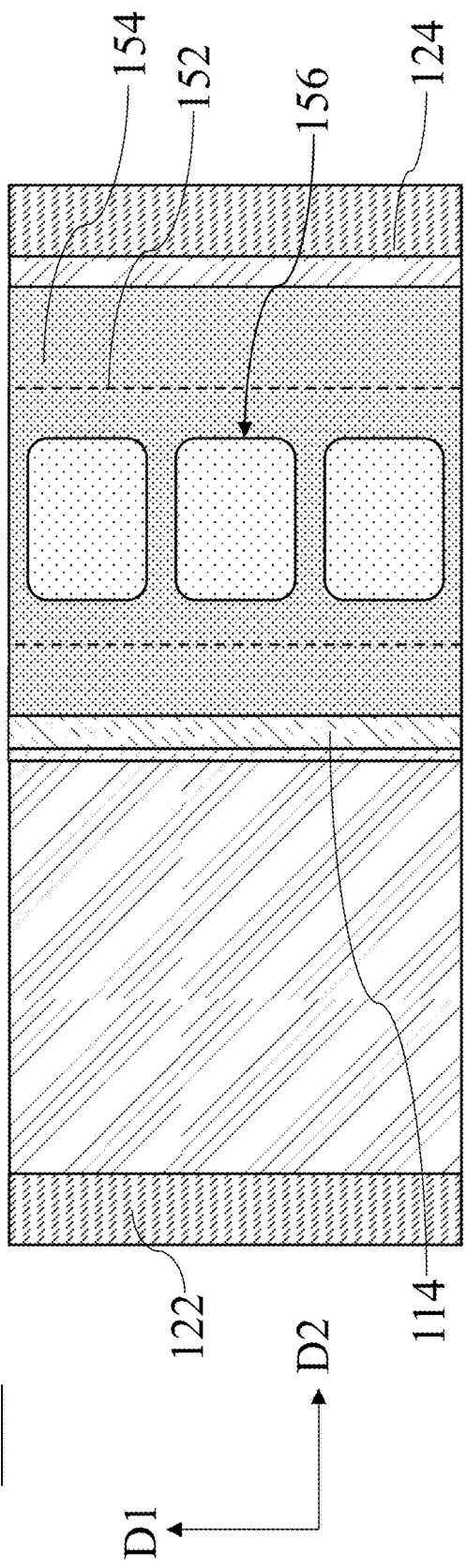

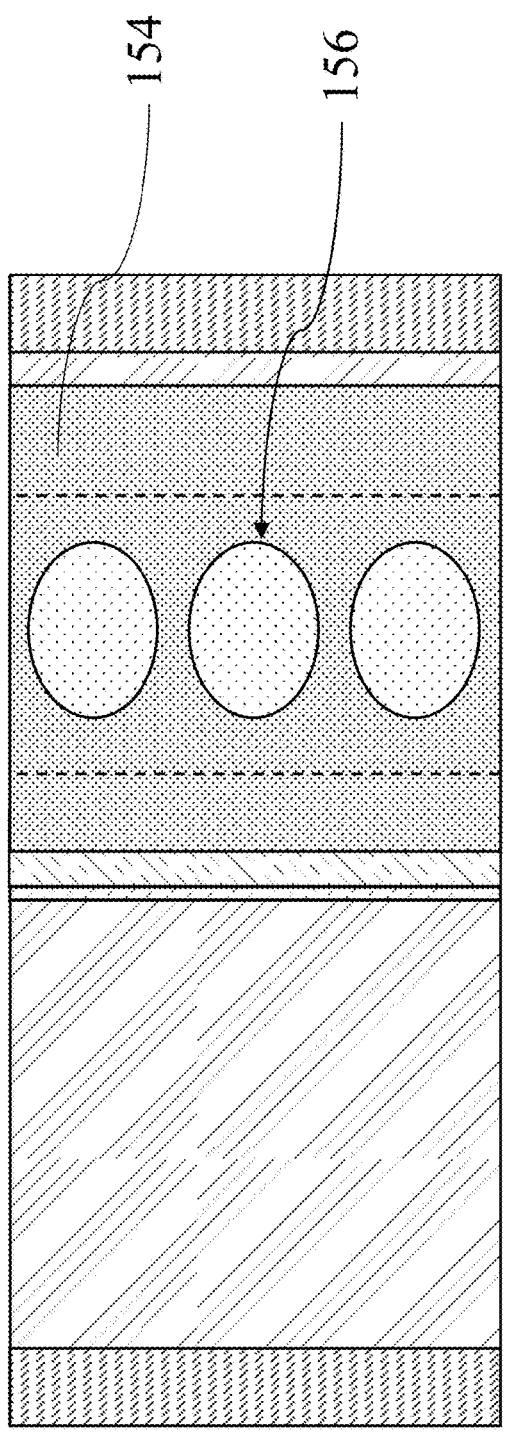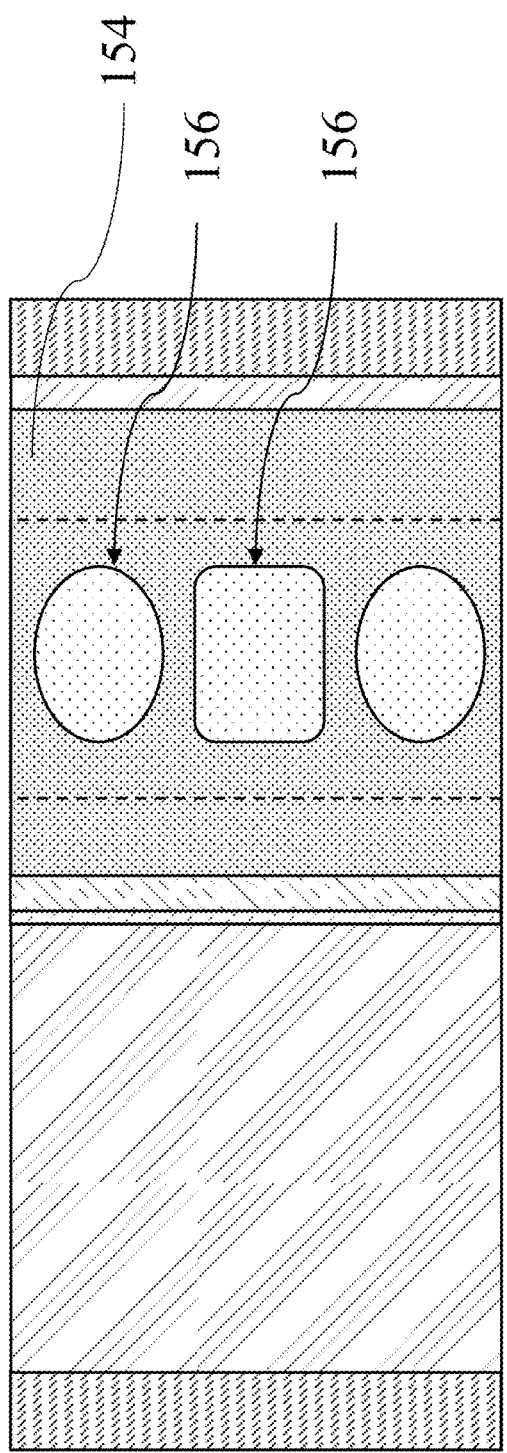

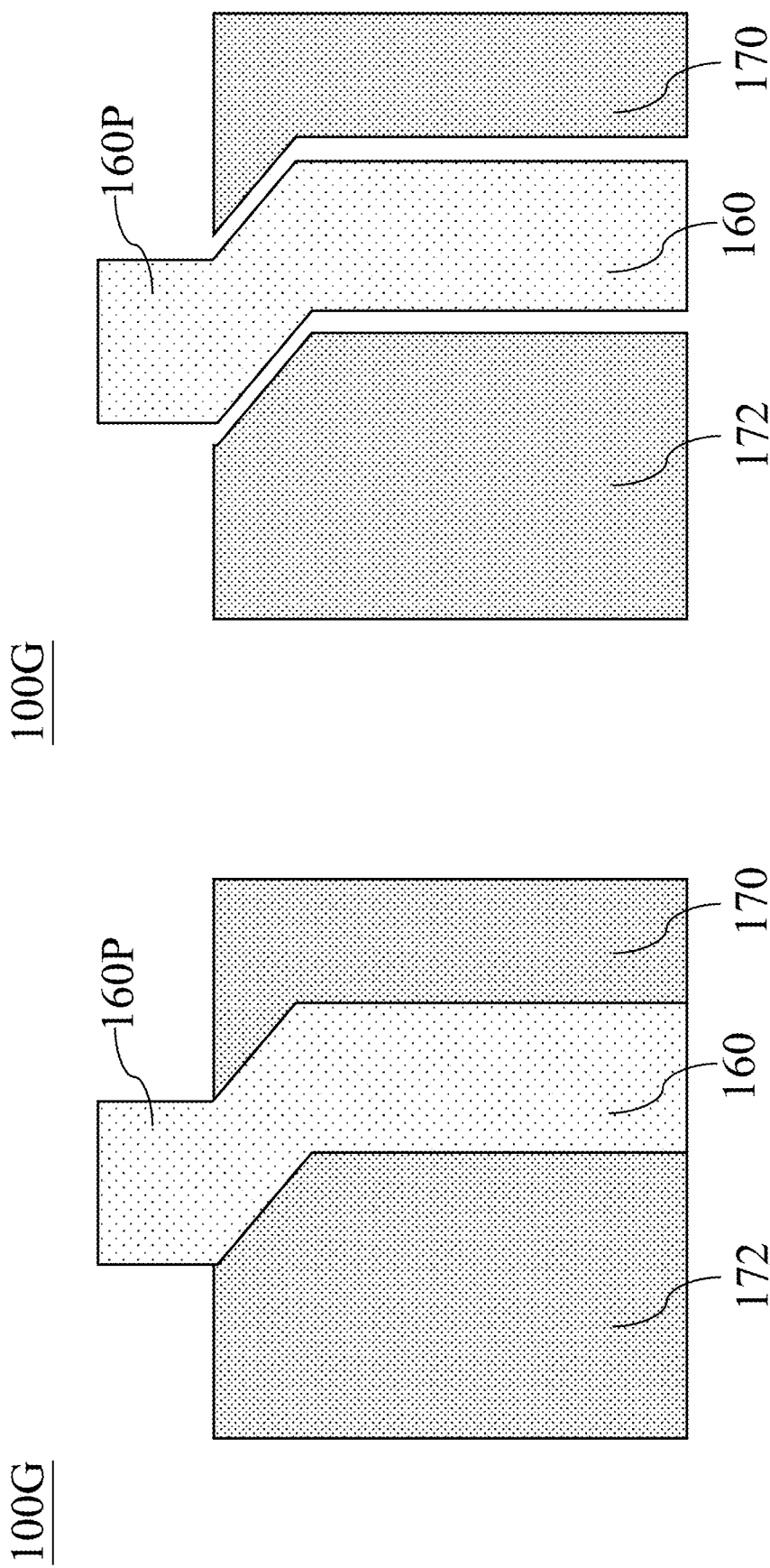

SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a nitride-based semiconductor device with a buried discontinuous field plate, thereby improving the electrical characteristics and the reliability thereof.

BACKGROUND OF THE DISCLOSURE

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

In order to avoid the breakdown phenomenon induced by a strong peak electric field near the edge of the gate electrode, the semiconductor device adopts a field plate to make the electric field distribution more uniform. Accordingly, the yield rate and the reliability of the formation of the field plate is related to the performance of the device.

SUMMARY OF THE DISCLOSURE

In accordance with one aspect of the present disclosure, a semiconductor device is provided. A semiconductor device includes a substrate, a first nitride-based semiconductor layer, a second nitride-based semiconductor layer, a gate electrode, a first field plate, a second discontinuous field plate, and a first dielectric layer. The second nitride-based semiconductor layer is disposed on the first nitride-based semiconductor layer and has a bandgap greater than a bandgap of the first nitride-based semiconductor layer. The gate electrode is disposed above the second nitride-based semiconductor layer. The first field plate is disposed above the second nitride-based semiconductor layer. The second discontinuous field plate is disposed above the second nitride-based semiconductor layer and in a position higher than the first field plate. The second discontinuous field plate includes one or more enclosed discontinuities in a discontinuity region thereof. The first dielectric layer is disposed above the second field plate. The first dielectric layer covers and penetrates the second discontinuous field plate in the discontinuity region such that the second field plate encloses at least one portion of the first dielectric layer within its one or more enclosed discontinuities.

In accordance with one aspect of the present disclosure, a semiconductor device is provided. A semiconductor device includes a first nitride-based semiconductor layer, a second nitride-based semiconductor layer, a gate electrode, a first field plate, a second field plate, and a third dielectric layer. The second nitride-based semiconductor layer is disposed on the first nitride-based semiconductor layer and has a bandgap greater than a bandgap of the first nitride-based semiconductor layer. The gate electrode is disposed above the second nitride-based semiconductor layer. The first field plate and the second field plate are disposed above the second nitride-based semiconductor layer. The third field plate is disposed above the second nitride-based semiconductor layer and in a position lower than the first and second field plates. The third field plate is in a region between the first and second field plates, and a vertical projection of the third field plate on the second nitride-based semiconductor layer are separated from vertical projections of the first and second field plates on the second nitride-based semiconductor layer.

In accordance with one aspect of the present disclosure, a method for manufacturing a semiconductor device is provided. The method includes steps as follows. A first nitride-based semiconductor layer is formed. A second nitride-based semiconductor layer is formed on the first nitride-based semiconductor layer. A gate electrode is formed over the second nitride-based semiconductor layer. A first field plate is formed above the gate electrode. A second field plate is formed above the gate electrode and the second field plate has at least one portion which vertically overlaps with the first field plate. The portion of the second field plate is removed to form at least one discontinuity region in the second field plate and the at least one discontinuity region is directly over the first field plate.

By the above configuration, the semiconductor device adopts a design that the discontinuous field plate includes one or more enclosed discontinuities which can lead to a reduction in its area, such that the stress generated by the field plate can be alleviated. Also, the field plate can uniformly reshape the electric field distribution as well. Thus, the probability of generating cracks can be reduced, and the electrical properties and the reliability of the semiconductor device can be improved.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIG. 2A, FIG. 2B, FIG. 2C, and FIG. 2D show different stages of a method for manufacturing a nitride-based semiconductor device according to some embodiments of the present disclosure;

FIG. 3 is a top view of a semiconductor device according to some embodiments of the present disclosure;

FIG. 4 is a top view of a semiconductor device according to some embodiments of the present disclosure;

FIG. 5 is a top view of a semiconductor device according to some embodiments of the present disclosure;

FIG. 6 is a top view of a semiconductor device according to some embodiments of the present disclosure;

FIG. 8A is a partially top view of a semiconductor device according to some embodiments of the present disclosure;

FIG. 8B is a partially top view of a semiconductor device according to some embodiments of the present disclosure;

DETAILED DESCRIPTION

Figure 1A:
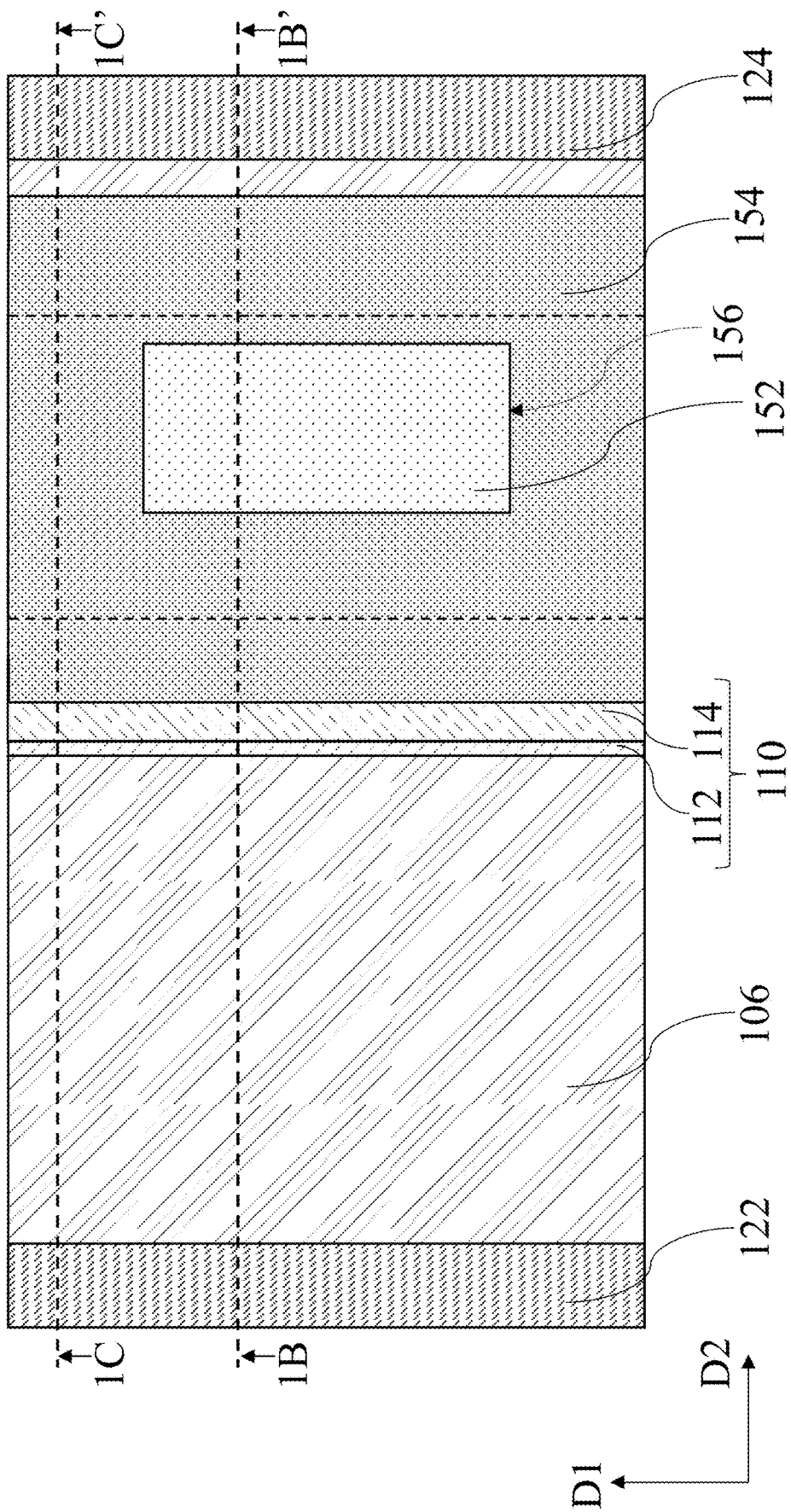
FIG. 1A is a top view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Figure 1B:
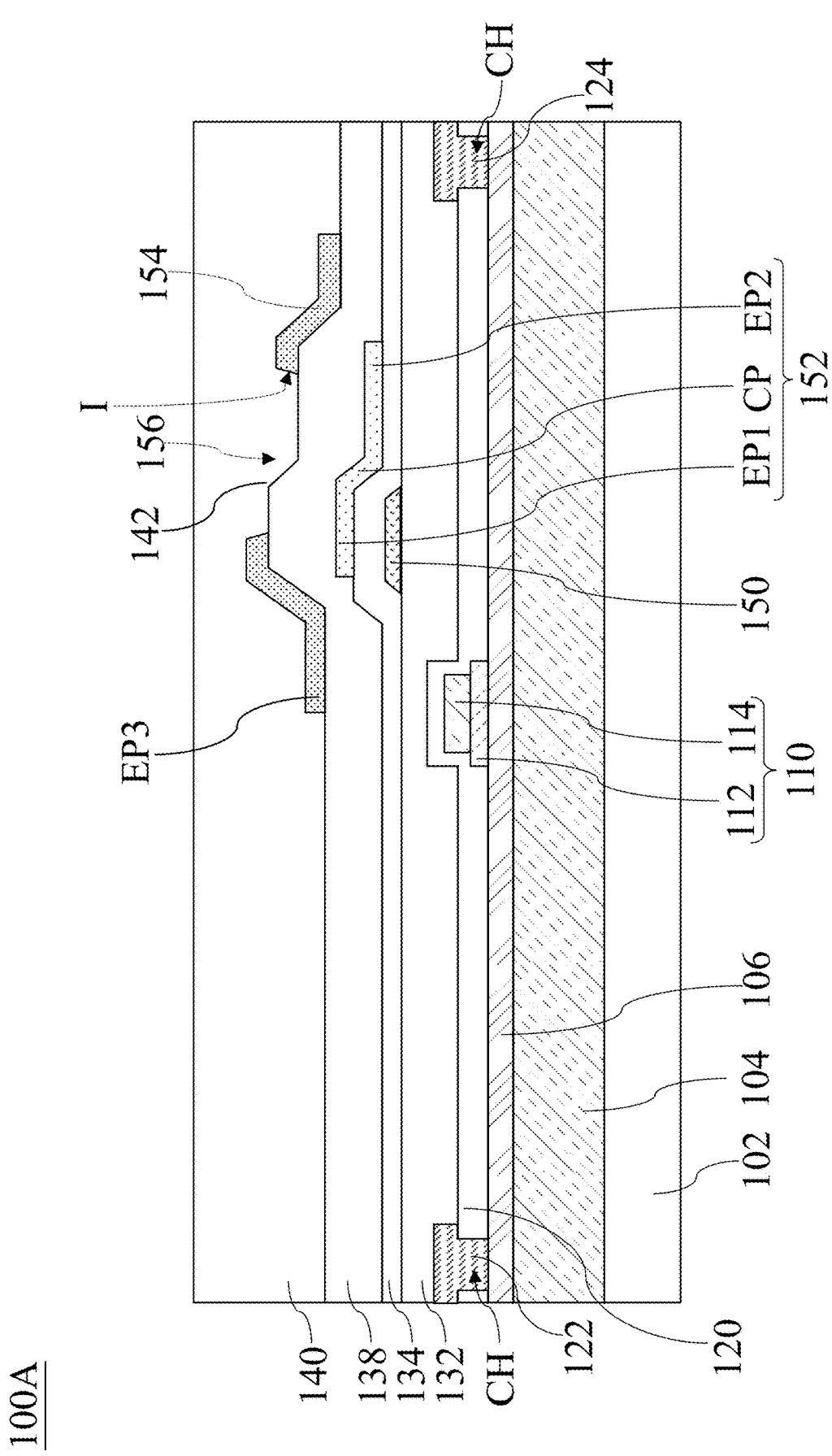
FIG. 1B is a vertical cross-sectional view across a line 1B-1B' in FIG. 1A.
Figure 1C:
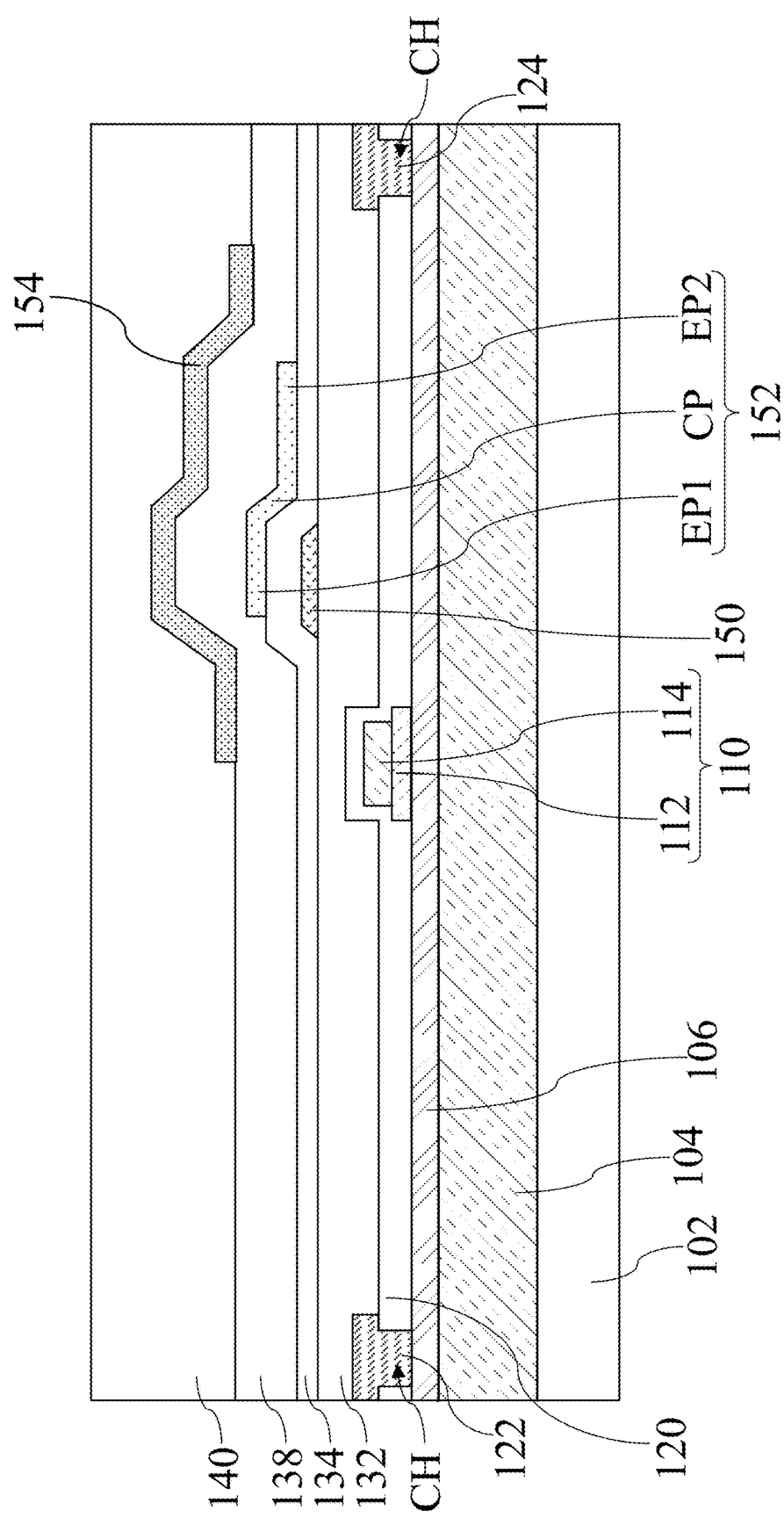
FIG. 1C is a vertical cross-sectional view across a line 1C-1C' in FIG. 1A.

FIG. 1A is a top view of a semiconductor device 100A according to some embodiments of the present disclosure. FIG. 1B is a vertical cross-sectional view across a line 1B-1B' in FIG. 1A. FIG. 1C is a vertical cross-sectional view across a line 1C-1C' in FIG. 1A. In order to make the description clear, directions D1 and D2 are labeled in FIG. 1A, which are different than each other. In some embodiments, the directions D1 and D2 are orthogonal to each other. For example, the direction D1 is a vertical direction of FIG. 1A, and the direction D2 is a horizontal direction of FIG. 1A. The semiconductor device 100A includes a substrate 102, nitride-based semiconductor layers 104 and 106, a gate structure 110, a dielectric layer 120, source/drain (S/D) electrodes 122 and 124, dielectric layers 132, 134, 138 and 140, and field plates 150, 152 and 154.

The substrate 102 may be a semiconductor substrate. The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 102 can include, for example, but is not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxial (epi) layer, or combinations thereof.

The nitride-based semiconductor layer 104 is disposed over the substrate 102. The nitride-based semiconductor layer 106 is disposed on the nitride-based semiconductor layer 104. The exemplary materials of the nitride-based semiconductor layer 104 can include, for example but are not limited to, nitrides or group III-V compounds, such as GaN, AlN, InN, $In_xAl_yGa_{(1-x-y)}N$ where x+y≤1, $Al_yGa_{(1-y)}N$ where y≤1. The exemplary materials of the nitride-based semiconductor layer 106 can include, for example but are not limited to, nitrides or group III-V compounds, such as GaN, AlN, InN, $In_xAl_yGa_{(1-x-y)}N$ where x+y≤1, $Al_yGa_{(1-y)}N$ where y≤1.

The exemplary materials of the nitride-based semiconductor layers 104 and 106 are selected such that the nitride-based semiconductor layer 106 has a bandgap (i.e., forbidden band width) greater than a bandgap of the nitride-based semiconductor layer 104, which causes electron affinities thereof different from each other and forms a heterojunction therebetween. For example, when the nitride-based semiconductor layer 104 is an undoped GaN layer having a bandgap of approximately 3.4 eV, the nitride-based semiconductor layer 106 can be selected as an AlGaN layer having bandgap of approximately 4.0 eV. As such, the nitride-based semiconductor layers 104 and 106 can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction. Accordingly, the semiconductor device 100A may include at least one GaN-based high-electron-mobility transistor (HEMT).

The gate structure 110 is disposed on/above/over the nitride-based semiconductor layer 106. The gate structure 110 includes a doped nitride-based semiconductor layer 112 and a gate electrode 114. The doped nitride-based semiconductor layer 112 and the gate electrode 114 can extend along the direction D1. The doped nitride-based semiconductor layer 112 is disposed on and in contact with the nitride-based semiconductor layer 106. The doped nitride-based semiconductor layer 112 is disposed between the nitride-based semiconductor layer 106 and the gate electrode 114. The gate electrode 114 is disposed on and in contact with the doped nitride-based semiconductor layer 112. In the exemplary illustration of FIG. 1A, a width of the doped nitride-based semiconductor layer 112 is greater than that of the gate electrode 114. In some embodiments, a width of the doped nitride-based semiconductor layer 112 is substantially the same as a width of the gate electrode 114. In the exemplary illustration of FIG. 1A, the profiles of the doped nitride-based semiconductor layer 112 and the gate electrode 114 are the same. For example, the doped nitride-based semiconductor layer 112 and the gate electrode 114 are rectangular profiles. In other embodiments, the profiles of the doped nitride-based semiconductor layer 112 and the gate electrode 114 can be different from each other. For example, the profile of the doped nitride-based semiconductor layer 112 can be a trapezoid profile, and the profile of the gate electrode 114 can be a rectangular profile.

In the exemplary illustration of FIG. 1A, the semiconductor device 100A is an enhancement mode device, which is in a normally-off state when the gate electrode 114 is at approximately zero bias. Specifically, the doped nitride-based semiconductor layer 112 may create at least one p-n junction with the nitride-based semiconductor layer 106 to deplete the 2DEG region, such that at least one zone of the 2DEG region corresponding to a position below the corresponding the gate electrode 114 has different characteristics (e.g., different electron concentrations) than the rest of the 2DEG region and thus is blocked. Due to such mechanism, the semiconductor device 100A has a normally-off characteristic. In other words, when no voltage is applied to the gate electrode 114 or a voltage applied to the gate electrode 114 is less than a threshold voltage (i.e., a minimum voltage required to form an inversion layer below the gate electrode 114), the zone of the 2DEG region below the gate electrode 114 is kept blocked, and thus no current flows therethrough.

In some embodiments, the doped nitride-based semiconductor layer 112 can be omitted, such that the semiconductor device 100A is a depletion-mode device, which means the semiconductor device 100A in a normally-on state at zero gate-source voltage.

The doped nitride-based semiconductor layer 112 can be a p-type doped III-V semiconductor layer. The exemplary materials of the doped nitride-based semiconductor layer 112 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd, and Mg. In some embodiments, the nitride-based semiconductor layer 104 includes undoped GaN and the nitride-based semiconductor layer 106 includes AlGaN, and the doped nitride-based semiconductor layer 112 is a p-type GaN layer which can bend the underlying band structure upwards and to deplete the corresponding zone of the 2DEG region, so as to place the semiconductor device 100A into an off-state condition.

The exemplary materials of the gate electrode 114 may include metals or metal compounds. The gate electrode 114 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds.

The dielectric layer 120 is disposed on the nitride-based semiconductor layer 106 and the gate structure 110. The dielectric layer 120 includes a plurality of contact holes CH. The dielectric layer 120 can be conformally disposed with the gate structure 110. The material of the dielectric layer 120 can include, for example but are not limited to, dielectric materials. For example, the dielectric layer 120 can include, for example but are not limited to, $SiN_x$, $SiO_x$, $Si_3N_4$, SiON, SiC, SiBN, SiCBN, oxides, nitrides, plasma enhanced oxide (PEOX), or combinations thereof. In some embodiments, the dielectric layer 120 can be a multi-layered structure, such as a composite dielectric layer of $Al_2O_3$/SiN, $Al_2O_3$/$SiO_2$, AlN/SiN, AlN/$SiO_2$, or combinations thereof.

The S/D electrodes 122 and 124 are disposed on/above/over the nitride-based semiconductor layer 106. The S/D electrodes 122 and 124 can extend along the direction D1. The gate electrode 114 and the S/D electrodes 122 and 124 can be arranged along the direction D2. The S/D electrodes 122 and 124 can extend through the contact holes CH of the dielectric layer 120 to make contact with the nitride-based semiconductor layer 106. In other words, the S/D electrodes 122 and 124 can penetrate the dielectric layer 120. The "S/D" electrode means each of the S/D electrodes 122 and 124 can serve as a source electrode or a drain electrode, depending on the device design.

The doped nitride-based semiconductor layer 112 and the gate electrode 114 are located between the S/D electrodes 122 and 124. That is, the S/D electrodes 122 and 124 can be located at two opposite sides of the gate electrode 114, respectively. In some embodiments, other configurations may be used, particularly when plural source, drain, or gate electrodes are employed in the device. In the exemplary illustration of FIGS. 1B and 1C, the S/D electrodes 122 and 124 are symmetrical about the gate electrode 114. In other embodiments, the S/D electrodes 122 and 124 are asymmetrical about the gate electrode 114. For example, the S/D electrode 122 can be closer to the gate electrode 114 than the S/D electrode 124.

In some embodiments, the S/D electrodes 122 and 124 can include, for example but are not limited to, metals, alloys, doped semiconductor materials (such as doped crystalline silicon), compounds such as silicides and nitrides, other conductor materials, or combinations thereof. The exemplary materials of the S/D electrodes 122 and 124 can include, for example but are not limited to, Ti, AlSi, TiN, or combinations thereof. The S/D electrodes 122 and 124 may be a single layer, or plural layers of the same or different composition. In some embodiments, the S/D electrodes 122 and 124 form ohmic contacts with the nitride-based semiconductor layer 106. The ohmic contacts can be achieved by applying Ti, Al, or other suitable materials to the S/D electrodes 122 and 124. In some embodiments, each of the S/D electrodes 122 and 124 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The dielectric layers 132, 134, 138, and 140 and the field plate 150, 152 and 154 can be alternately stacked/disposed on/above/over the dielectric layer 120. The exemplary material of the dielectric layers 132, 134, 138 and 140 can be identical with or similar with that of the dielectric layer 120. The materials of the field plates 150, 152 and 154 can include, for example but are not limited to, conductive materials, such as Ti, Ta, TiN, TaN, or combinations thereof. In some embodiments, other conductive materials such as Al, Cu, doped Si, and alloys including these materials may also be used.

The dielectric layer 132 is disposed on and covers the S/D electrodes 122 and 124 and the dielectric layer 120. In some embodiments, the dielectric layer 132 can have a flat top surface.

The field plate 150 is disposed on/above the nitride-based semiconductor layer 106 and the dielectric layer 132. The field plate 150 is closest to the nitride-semiconductor layer 106 among the field plates 150, 152 and 154. The field plate 150 covers a portion of the top surface of the dielectric layer 132. The field plate 150 is disposed between the gate electrode 114 and the S/D electrode 124. In addition, a profile of the field plate 150 can be, for example, a trapezoid profile. In some embodiments, the field plate 150 can be a continuous field plate. Herein, the phrase "continuous field plate" means that the field plate 150 has no inner boundary/border between the two opposite edges thereof in any vertical cross-sectional view of the same field plate. Explained in another way, between the two opposite edges of the field plate 150, no layer penetrates the field plate.

The dielectric layer 134 is disposed on the dielectric layer 132 and the field plate 150. The dielectric layer 134 can be conformal with the field plate 150, so as to form a protruding portion corresponding to the field plate 150. The protruding portion of the dielectric layer 134 can have, for example, a trapezoid profile. The field plate 150 is sandwiched/buried between and in contact with the two adjacent dielectric layers 132 and 134.

The field plate 152 is disposed on/above the nitride-based semiconductor layer 106 and the dielectric layer 134. The field plate 152 is second closest to the nitride-semiconductor layer 106 among the field plates 150, 152 and 154. The field plate 150 can be disposed between the gate electrode 114 and field plate 152. The field plate 152 can extend along the direction D1. The field plate 152 is located at a position higher than the field plate 150. The field plate 152 can include end portions EP1 and EP2 and a central portion CP connected to and located between the end portions EP1 and EP2, in which the end portions EP1 and EP2 are opposite to each other. The end portion EP1 covers and is in contact with the protruding portion of the dielectric layer 134. In some embodiments, the field plate 152 can be a continuous field plate.

The dielectric layer 138 is disposed on/above the dielectric layer 134 and the field plate 152. The dielectric layer 138 covers the dielectric layer 134 and the field plate 152. The field plate 152 is buried/sandwiched between the two dielectric layers 134 and 138. The dielectric layer 134 is disposed between and in contact with the two adjacent field plates 150 and 152. The dielectric layer 138 can be conformal with the field plate 152 to form a protruding portion corresponding to the field plate 152.

The field plate 154 is disposed on/above the nitride-based semiconductor layer 106 and the dielectric layer 138. The dielectric layer 138 is disposed between and in contact with the two adjacent field plates 152 and 154. The field plate 154 is farthest to the nitride-semiconductor layer 106 among the field plates 150, 152 and 154. The field plate 154 can extend along the direction D1. The field plate 154 is located at a position higher than the field plate 152. The field plate 154 is disposed in a region between the gate electrode 114 and the S/D electrode 124. The field plate 154 can have an end portion EP3 directly above the gate electrode 114, which means that at least a part of the field plate 154 overlaps with the gate electrode 114.

Regarding a configuration of multiple field plates, generally, the top-most field plate would be designed to have the largest area among all the field plates. Accordingly, an oversized area issue may occur at the top-most field plate. The oversized area issue would result in a significant stress which induces cracks at underlying element layers, such as a dielectric layer beneath the same field plate, and the cracks would negatively affect the electrical properties and reliability of the device.

With respect to the oversized area issue, the field plate 154 can be designed as a discontinuous field plate for the purpose of avoiding accumulation of stress. Such a configuration can alleviate the afore-mentioned negative effects due to stress. Herein, the phrase "discontinuous field plate" means that, in at least one vertical cross-sectional view of the field plate 154, the field plate 154 has at least one inner boundary/border between the two opposite edges thereof. Explained in another way, between the two opposite edges of the field plate 154, at least one layer would penetrate the field plate 154. For example, the dielectric layer 140 can penetrate the field plate 154 to make contact with the dielectric layer 138 and form at least one interface I with the inner boundary/border of the field plate 154.

To be more specific, referring to FIGS. 1A and 1B, the field plate 154 includes, for example, one enclosed discontinuity in a discontinuity region 156 thereof. The enclosed discontinuity can be defined by the inner boundary of the discontinuity region 156. The discontinuity region 156 can be referred to as an aperture/opening of the field plate 154. Accordingly, the discontinuity region 156 of the field plate 154 has two or more inner sidewalls facing each other. In some embodiment, the length of the discontinuity region 156 along the direction D1 is greater than the length of the discontinuity region 156 along the direction D2.

As compared with a continuous field plate, the area of the field plate 154 can be reduced by creating the enclosed discontinuity in the discontinuity region 156. As such, the accumulation of the stress in the field plate 154 can be lowered, thereby improving the reliability thereof. Moreover, reducing the field plate 154 is achieved such that the parasitic capacitance is weakened, thereby providing a good electrical characteristic.

Although the enclosed discontinuity is created in the discontinuity region 156 of the field plate 154 (i.e., the aperture/opening of the field plate 154), the field plate 154 is still arranged to vertically overlap with at least one portion of the field 152. In some embodiments, the discontinuity region 156 of the field plate 154 has the area less than the area of the filed plate 154, such that the inner boundary/border of the field plate 154 is located directly above the field plate 152. In some embodiments, a vertical projection of the inner boundary of the discontinuity region 156 of the field plate 154 on the field plate 152 is entirely within the field plate 152. Therefore, the two opposite end portions EP1 and EP2 of the field plate 152 can vertically overlap with the field plate 154. The central portion CP is located directly beneath the discontinuity region 156 and thus is free from coverage of the field plate 154. The combination of the field plates 152 and 154 in the top view (e.g., FIG. 1A) is continuous (i.e., no gap between them in the top view). Therefore, due to shielding effect, the overlapping field plates 152 and 154 can still reshape the distribution of the electric field in the semiconductor device 100A, maintaining a good electric field modulation for the semiconductor device 100A. By such a configuration, reducing the accumulation of the stress with remaining the electric field modulation effect in the semiconductor device 100A is achieved.

The inner boundary of the discontinuity region 156 surrounding the enclosed discontinuity can have a plurality of straight edges. For example, the inner boundary of the discontinuity region 156 can be in a shape of quadrilateral, such as rectangular, square, rhombus, or trapezoid. In other embodiments, the inner boundary of the discontinuity region 156 surrounding the enclosed discontinuity can be designed as being other shapes, such as triangle, pentagon, hexagon, or polygons.

The dielectric layer 140 is disposed on/above the field plate 154 and the dielectric layer 138. The dielectric layer 140 covers the field plate 154. The field plate 154 is sandwiched/buried between and in contact with the two adjacent dielectric layers 138 and 140.

The dielectric layer 140 can have at least a portion 142 penetrating the field plate 154. More specifically, the portion 142 of the dielectric layer 140 extends into/fills with the discontinuity region 156 of the field plate 154 (i.e., the aperture/opening of the field plate 154) to form the interface I between the dielectric layer 140 and the field plate 154. The portion 142 of the dielectric layer 140 is located directly above the field plate 152. That is to say, the portion 142 of the dielectric layer 140 can be in contact with the dielectric layer 138 through the discontinuity region 156 of the field plate 154. The field plate 154 can enclose the portion 142 of the dielectric layer 140 within its enclosed discontinuity, and therefore the field plate 154 can accommodate a material different than itself in the discontinuity region 156. For example, a dielectric material of the dielectric layer 140 can be accommodated.

In addition, the dielectric layer 140 can serve as a planarization layer which has a level top surface to support other layers/elements. In some embodiments, the dielectric layer 140 can be formed as a thicker layer, and a planarization process, such as chemical mechanical polish (CMP) process, is performed on the dielectric layer 140 to remove the excess portions, thereby forming a level top surface Different stages of a method for manufacturing the semiconductor device 100A are shown in FIG. 2A, FIG. 2B, FIG. 2C and FIG. 2D, described below. For clarity, manufacturing stages of some element layers such as dielectric layers 120, 132, 134, 138 and 140 are omitted.

In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Referring to FIG. 2A, a nitride-based semiconductor layer 106 is provided. The nitride-based semiconductor layer 106 can be formed on another nitride-based semiconductor layer (not shown). S/D electrodes 122 and 124, a doped nitride-based semiconductor 112, a gate electrode 114 and a field plate 150 can be formed over a nitride-based semiconductor layer 106 by using deposition techniques. The doped nitride-based semiconductor 112 and the gate electrode 114 are formed between the S/D electrodes 122 and 124. The field plate 150 is formed between the gate electrode 114 and the S/D electrode 124. The formation of the doped nitride-based semiconductor layer 112, the gate electrode 114 and the field plate 150 includes a patterning process. In some embodiments, the deposition techniques can be performed for forming a blanket layer, and the patterning process can be performed for removing excess portions thereof. In some embodiments, the patterning process can include photolithography, exposure and development, etching, other suitable processes, or combinations thereof.

Referring to FIG. 2B, a field plate 152 is formed on the gate electrode 114 and the field plate 150 (see FIG. 2A). The field plate 152 is formed between the gate electrode 114 and the S/D electrode 124. The field plate 152 is formed to have an area greater than the field plate 150. The manufacturing stage of the field plate 152 can be identical with or similar with that of the field plate 150.

Figure 2C:
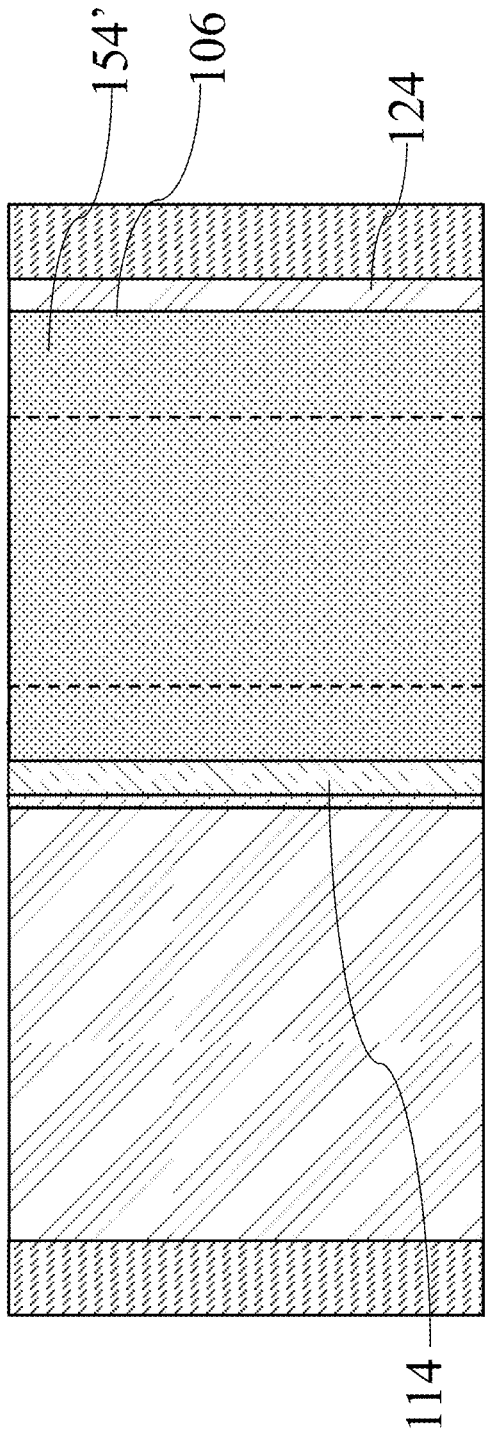

Referring to FIG. 2C, an intermediate field plate 154' is formed on the resultant structure in FIG. 2B to cover the field plate 152. The intermediate field plate 154' is located in a region between the gate electrode 114 and the S/D electrode 124. The intermediate field plate 154' is formed to have an area greater than the field plate 152.

Figure 2D:
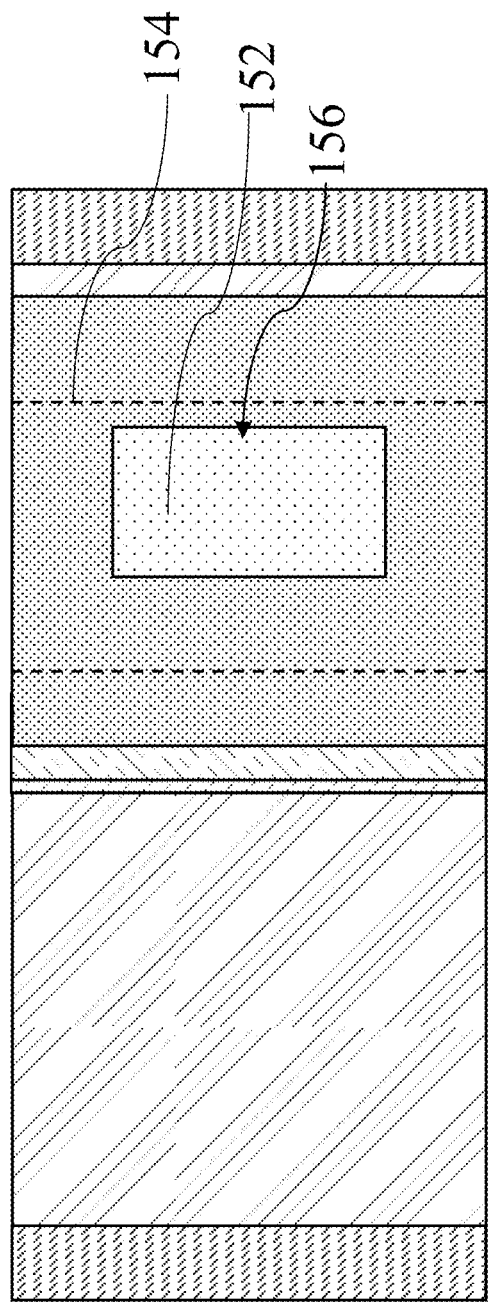

Referring to FIG. 2D, a portion of the intermediate field plate 154' is removed to form at least one discontinuity region 156 in the intermediate field plate 154', so as to form a field plate 154. The removed portion is directly over/above the field plate 152. The field plate 152 can be exposed from the discontinuity region 156. Thereafter, a dielectric layer 140 can be formed, obtaining the configuration of the semiconductor device 100A as shown in FIGS. 1A, 1B and 1C.

FIG. 3 is a top view of a semiconductor device 100B according to some embodiments of the present disclosure. In order to make the description clear, directions D1 and D2 are labeled in FIG. 3. In the exemplary illustration of FIG. 3, the discontinuity region 156 of the field plate 154 has a curved inner boundary in the discontinuity region 156. The curved inner boundary is advantageous to the distribution of the accumulation of the stress. Specifically, the discontinuity region 156 is in a shape of ellipse, in which the ellipse has a major axis LA parallel to the direction D1 and a minor axis SA parallel to the direction D2. In some embodiments, the ellipse can be obliquely disposed such that the major axis LA and the minor axis SA can be inclined with respect to the direction D1 or D2. In other embodiments, the discontinuity region 156 is in a shape of circle.

FIG. 4 is a top view of a semiconductor device 100C according to some embodiments of the present disclosure. In order to make the description clear, directions D1 and D2 are labeled in FIG. 4. In the exemplary illustration of FIG. 4, the number of the discontinuity regions 156 of the field plate 154 can be multiple, for example, three discontinuity regions 156, but the disclosure is not limited thereto. These discontinuity regions 156 are separated from each other. The discontinuity regions 156 are arranged along the direction D1, in which the field plate 152 and 154, the S/D electrodes 122 and 124 and the gate electrode 114 extend along the direction D1. In some embodiments, the discontinuity regions 156 of the field plate 154 are in a shape of rectangular with rounded corners. Since the dielectric layer coving the field plate 154 can penetrate the field plate 154 (e.g., the dielectric layer 140 of FIG. 1B), such dielectric layer can have a plurality of portions enclosed by the discontinuity regions 156 of the field plate 154. These portions of the dielectric layer can extend/fill into these discontinuity regions 156. Accordingly, these extending portions of the dielectric layer are separated from each other by the discontinuity regions 156 of field plate 154.

FIG. 5 is a top view of a semiconductor device 100D according to some embodiments of the present disclosure. In the exemplary illustration of FIG. 5, the field plate 154 can have a plurality of separated discontinuity regions 156. The discontinuity regions 156 of the field plate 154 are in a shape of ellipse. Similarly, the curved inner boundaries of the discontinuity regions 156 are advantageous to the distribution of the accumulation of the stress.

FIG. 6 is a top view of a semiconductor device 100E according to some embodiments of the present disclosure. In the exemplary illustration of FIG. 6, the field plate 154 can have a plurality of separated discontinuity regions 156, in which the discontinuity regions 156 have different shapes. A group of the discontinuity regions 156 can be in a shape of ellipse, and another group of the discontinuity region 156 can be in a shape of rectangular with rounded corners.

Figure 7A:
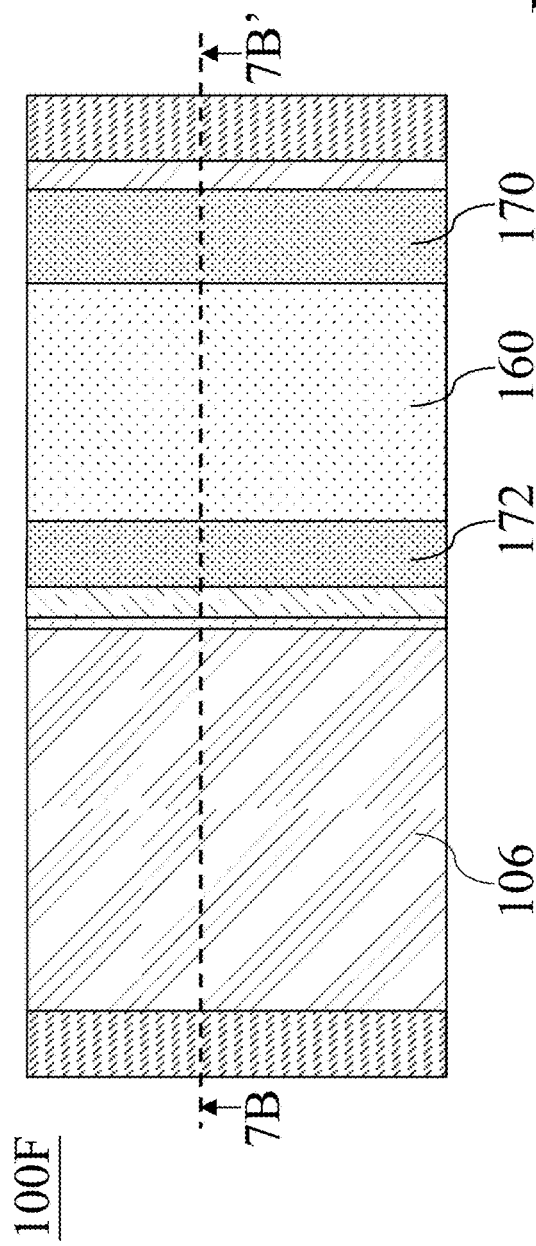
FIG. 7A is a top view of a semiconductor device according to some embodiments of the present disclosure.
Figure 7B:
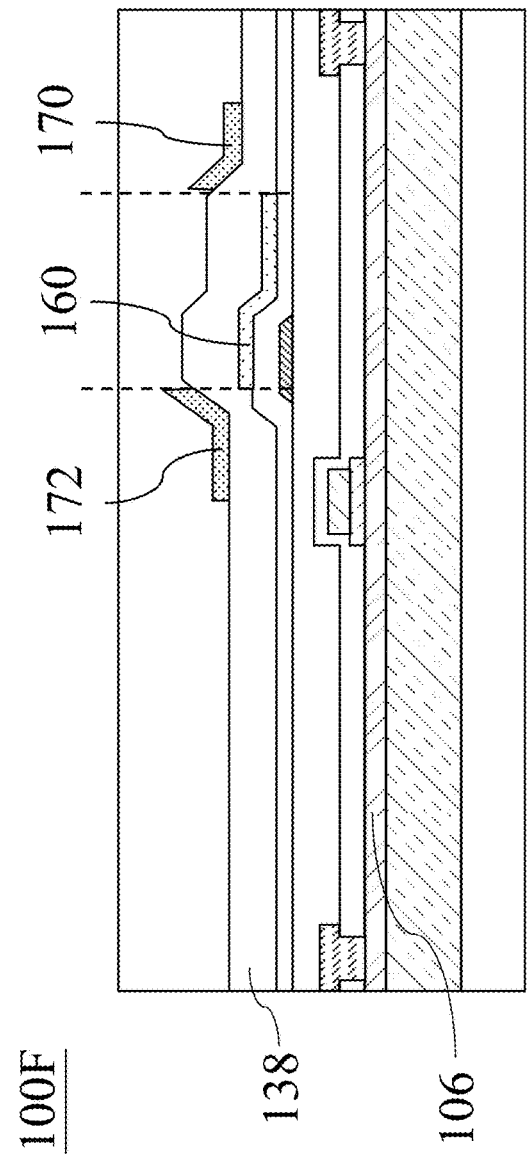
FIG. 7B is a vertical cross-sectional view across a line 7B-7B' in FIG. 7A.

FIG. 7A is a top view of a semiconductor device 100F according to some embodiments of the present disclosure. FIG. 7B is a vertical cross-sectional view across a line 7B-7B' in FIG. 7A. In the exemplary illustration of FIGS. 7A and 7B, field plates 160, 170, and 172 are disposed above the nitride-based semiconductor layer 106. The field plate 160 is covered by the dielectric layer 138. The field plates 170 and 172 are disposed on the dielectric layer 138. Each of the field plates 170 and 172 is in a position higher than the field plate 160. From a side view of the semiconductor device 100F, the field plate 160 is in a region between the field plates 170 and 172. Orthogonal/vertical projections of the field plates 170 and 172 on the nitride-based semiconductor layer 106 are separated from a vertical projection of the field plate 160 on the nitride-based semiconductor layer 106. Such a configuration makes the accumulation of the stress reduced and remains the electric field modulation in the semiconductor device 100G.

In other embodiments, the outlines of the field plates 160, 170, and 172 can be designed with coincidence. For example, FIG. 8A is a partially top view of a semiconductor device 100G according to some embodiments of the present disclosure. For clarity, some elements/layers are omitted in FIG. 8A. In the exemplary illustration of FIG. 8A, the field plate 160 is located between the field plates 170 and 172. The field plate 160 has a left portion having an outline identical with a right outline of the field plate 170. The field plate 160 has a right portion having an outline identical with a left outline of the field plate 172. Herein, the "identical outline" means have absolutely the same profile. For example, FIG. 9B shows the field plates 170 and 172 moving away from the field plate 160, so as to show how the coincidence of the profiles is. Furthermore, the field plate 160 can further have a protruding portion 160P which can be configured to connect to a conductive vias (not illustrated) in the semiconductor device 100G.

Figure 9:
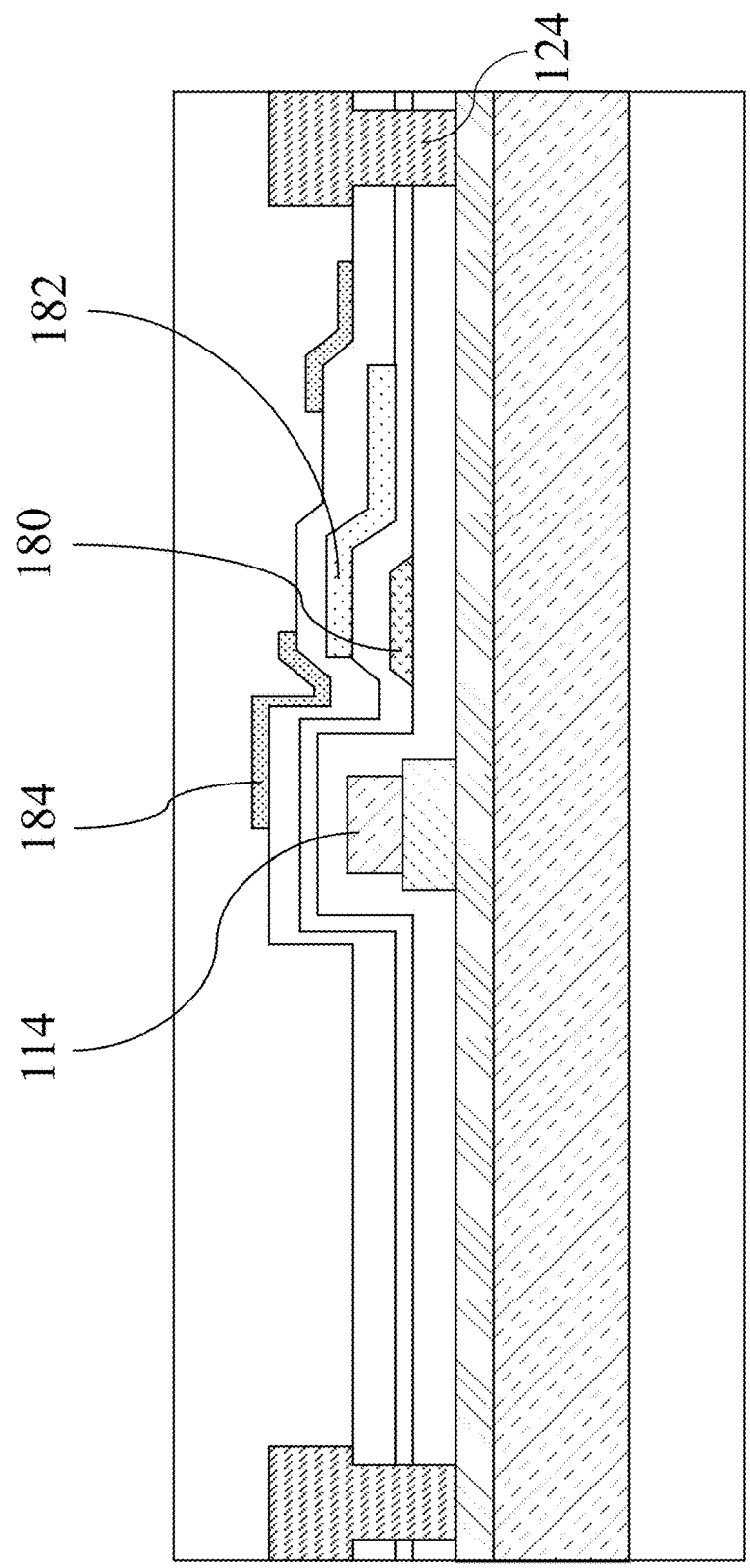
FIG. 9 is a vertical cross-sectional view of a semiconductor device according to some embodiments of the present disclosure.

FIG. 9 is a vertical cross-sectional view of a semiconductor device 100H according to some embodiments of the present disclosure. In the exemplary illustration of FIG. 9, the field plate 180, 182 and 184 are disposed between the gate electrode 114 and the S/D electrode 124. The field plate 180, 182 and 184 are stacked in sequence. The field plate can be positioned at a portion lower than a top surface of the gate electrode 114. At least a part of the field plate 182 can be positioned at a position lower than the top surface of the gate electrode 114, and the other part is in a position higher than the top surface of the gate electrode 114. The field plate 184 can have the similar configuration as the field plate 152 as afore-described.

Figure 10:
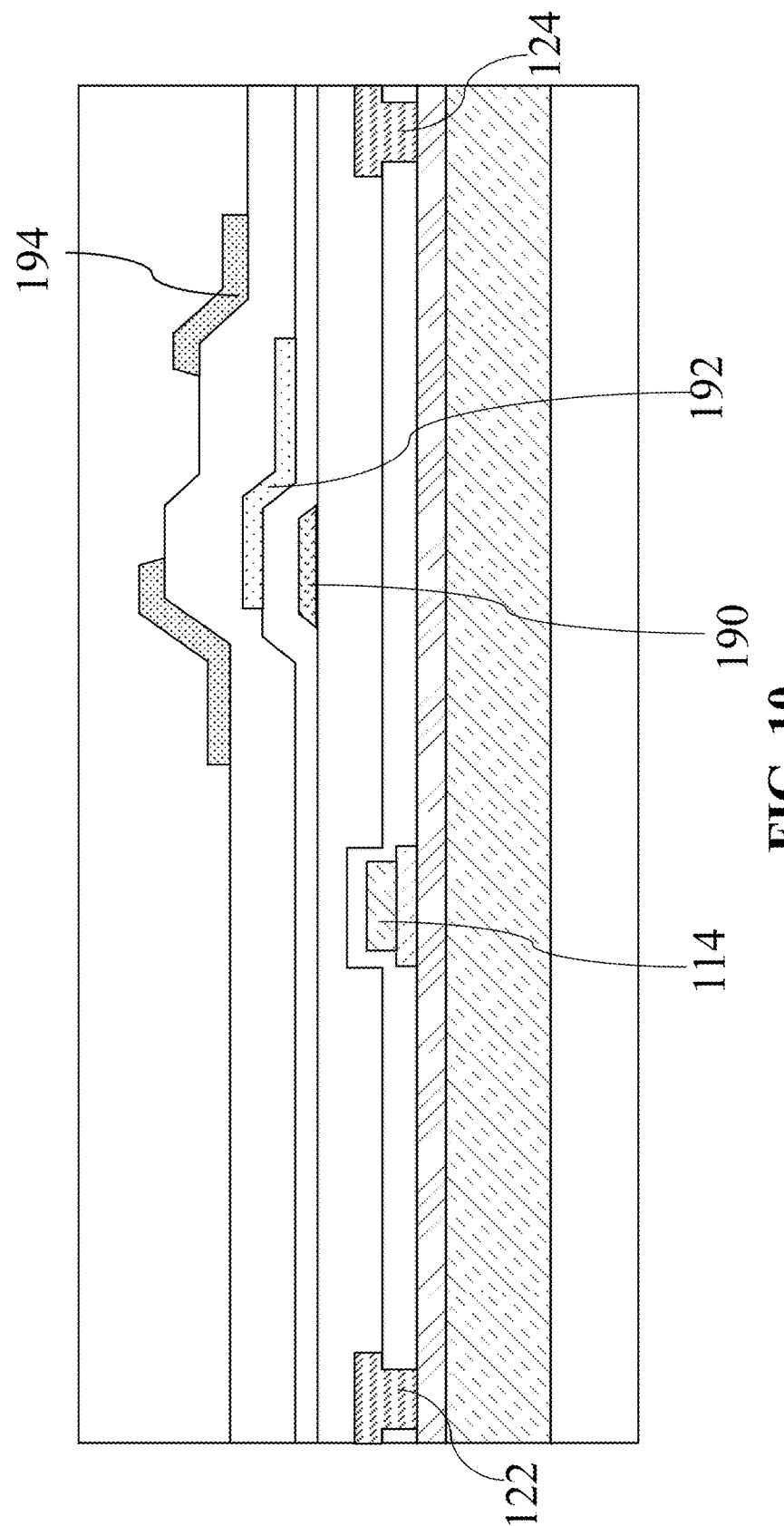
FIG. 10 is a vertical cross-sectional view of a semiconductor device according to some embodiments of the present disclosure.

FIG. 10 is a vertical cross-sectional view of a semiconductor device 100I according to some embodiments of the present disclosure. In the exemplary illustration of FIG. 10, the S/D electrodes 122 and 124 are asymmetrical about the gate electrode 114. For example, the S/D electrode 122 can be closer to the gate electrode 114 than the S/D electrode 124, which means that a distance between the S/D electrode 124 and the gate electrode 114 is greater than a distance between the S/D electrode 122 and the gate electrode 114. The field plate 190, 192, and 194 are disposed between the gate electrode 114 and the S/D electrode 122. In the exemplary illustration of FIG. 10, the field plate 194 has no portion vertically overlapping with the gate electrode 114, but the present disclosure is not limited thereto. In other embodiments, the field plate 194 can have a portion vertically overlapping with the gate electrode 114.

Based on the above description, in the embodiments of the present disclosure, the top-most field plate can be provided with at least one or more discontinuities in a discontinuity region which leads to an area reduction, such that the negative influence caused by the stress can be mitigated. Furthermore, the location of the discontinuity region can be designed such that the top-most field plate overlaps with another field plate. Such a configuration would not weaken the effect of reshaping the electric field distribution. Accordingly, the semiconductor device of the present disclosure can have good electrical properties and reliability.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:
1. A semiconductor device, comprising:
a first nitride-based semiconductor layer;
a second nitride-based semiconductor layer disposed on
the first nitride-based semiconductor layer and having a bandgap greater than a bandgap of the first nitride-based semiconductor layer;
a gate electrode disposed above the second nitride-based semiconductor layer;
a first field plate disposed above the second nitride-based semiconductor layer;
a second discontinuous field plate disposed above the second nitride-based semiconductor layer and in a position higher than the first field plate, the second discontinuous field plate including one or more enclosed discontinuities in a discontinuity region thereof, wherein the discontinuity region of the second discontinuous field plate is non-overlapping with the gate electrode in a vertical direction, and the second discontinuous field plate is structurally separated from the first field plate; and
a first dielectric layer disposed above the second discontinuous field plate, wherein the first dielectric layer covers and penetrates the second discontinuous field plate in the discontinuity region such that the second discontinuous field plate encloses at least one portion of the first dielectric layer within its one or more enclosed discontinuities.

2. The semiconductor device of claim 1, wherein the at least one portion of the first dielectric layer is directly above the first field plate; and
the at least one portion of the first dielectric layer is non-overlapping with the gate electrode in the vertical direction.

3. The semiconductor device of claim 1, wherein the first field plate has two opposite end portions vertically overlapping with the second discontinuous field plate and a central portion between the end portions, and the central portion is free from coverage of the second discontinuous field plate.

4. The semiconductor device of claim 1, wherein the second discontinuous field plate has an inner boundary surrounding the one or more enclosed discontinuities in a shape of rectangle, circle, ellipse, or combinations thereof.

5. The semiconductor device of claim 4, wherein a vertical projection of the inner boundary of the discontinuity region of the second discontinuous field plate on the first field plate is entirely within the first field plate.

6. The semiconductor device of claim 1, wherein the second discontinuous field plate has a curved inner boundary in the discontinuity region.

7. The semiconductor device of claim 1, wherein there are a plurality of portions of the first dielectric layer that are enclosed by the discontinuity region of the second discontinuous field plate.

8. The semiconductor device of claim 7, wherein the plurality of portions of the first dielectric layer are separated from each other by the discontinuity region of the second discontinuous field plate.

9. The semiconductor device of claim 7, wherein the gate electrode, the first field plate, and the second discontinuous field plate extend along a direction, and the plurality of portions of the first dielectric layer are arranged along the direction.

10. The semiconductor device of claim 1, wherein the second discontinuous field plate has an end portion directly above the gate electrode.

11. The semiconductor device of claim 1, further comprising:
a second dielectric layer disposed between the first field plate and the second discontinuous field plate, the at least one portion of the first dielectric layer is in contact with the second dielectric layer through the second discontinuous field plate.

12. The semiconductor device of claim 1, further comprising:
a third field plate disposed between the gate electrode and the first field plate and vertically overlapping with the first field plate.

13. The semiconductor device of claim 1, wherein the discontinuity region of the second discontinuous field plate has two inner sidewalls facing each other.

14. A semiconductor device, comprising:
a first nitride-based semiconductor layer;
a second nitride-based semiconductor layer disposed on the first nitride-based semiconductor layer and having a bandgap greater than a bandgap of the first nitride-based semiconductor layer;
a gate electrode disposed above the second nitride-based semiconductor layer;
a first field plate and a second field plate disposed above the second nitride-based semiconductor layer; and
a third field plate disposed above the second nitride-based semiconductor layer and in a position lower than the first and second field plates, wherein the third field plate is in a region between the first and second field plates, and a vertical projection of the third field plate on the second nitride-based semiconductor layer is separated from vertical projections of the first and second field plates on the second nitride-based semiconductor layer, the region between the first and second field plates is non-overlapping with the gate electrode in a vertical direction, and the first and second field plates are structurally separated from the third field plate.

15. The semiconductor device of claim 14, wherein a first portion of the third field plate has an outline identical with that of the first field plate; and
the vertical projection of the third field plate on the second nitride-based semiconductor layer is separated from a vertical projection of the gate electrode on the second nitride-based semiconductor layer.

16. The semiconductor device of claim 15, wherein a second portion of the third field plate is opposite the first portion and has an outline identical with that of the second field plate.

17. A method for manufacturing a semiconductor device, comprising:
forming a first nitride-based semiconductor layer;
forming a second nitride-based semiconductor layer on the first nitride-based semiconductor layer;
forming a gate electrode over the second nitride-based semiconductor layer;
forming a first field plate above the gate electrode;
forming a second field plate above the gate electrode and at least partially overlapping vertically with the first field plate; and
removing at least one portion of the second field plate to form at least one discontinuity region in the second field plate and directly over the first field plate, wherein the at least one discontinuity region of the second field plate is non-overlapping with the gate electrode in a vertical direction, and the second field plate is structurally separated from the first field plate.

18. The method of claim 17, wherein the second field plate is formed to have an area greater than that of the first field plate.

19. The method of claim 17, wherein the at least one discontinuity region of the second field plate is in a shape of rectangle, circle, ellipse, or combinations thereof.

20. The method of claim 17, wherein a vertical projection of the at least one discontinuity region of the second field plate on the first field plate is entirely within the first field plate.

* * * * *